(12) United States Patent
Sundahl

(10) Patent No.: US 6,870,519 B2
(45) Date of Patent: Mar. 22, 2005

(54) METHODS FOR TILING MULTIPLE DISPLAY ELEMENTS TO FORM A SINGLE DISPLAY

(75) Inventor: Robert C. Sundahl, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 426 days.

(21) Appl. No.: 09/821,541

(22) Filed: Mar. 28, 2001

(65) Prior Publication Data

US 2002/0140629 A1 Oct. 3, 2002

(51) Int. Cl.$^7$ ................................................ G09G 5/00
(52) U.S. Cl. .................... 345/1.3; 345/76; 313/500; 315/169.3
(58) Field of Search ................ 345/1.1, 1, 4, 88, 345/72, 77, 1.4, 903, 1.3, 102, 73, 82, 98, 32, 76, 87, 100; 315/169.3; 349/73, 122, 74, 158

(56) References Cited

U.S. PATENT DOCUMENTS

| | | | |
|---|---|---|---|
| 4,536,856 A | | 8/1985 | Hiroishi |
| 4,760,388 A | | 7/1988 | Tatsumi et al. |
| 4,800,376 A | | 1/1989 | Suga et al. |
| 4,839,638 A | | 6/1989 | Kosler et al. |
| 5,483,255 A | | 1/1996 | Numao |
| 5,754,153 A | | 5/1998 | Mizutome et al. |
| 5,805,117 A | * | 9/1998 | Mazurek et al. ............... 345/1.3 |
| 5,808,710 A | * | 9/1998 | Pierson ........................... 349/73 |
| 5,838,405 A | * | 11/1998 | Izumi et al. ..................... 349/73 |
| 5,903,328 A | * | 5/1999 | Greene et al. ................... 349/73 |
| 6,243,059 B1 | * | 6/2001 | Greene et al. ................... 345/88 |
| 6,262,696 B1 | * | 7/2001 | Seraphim et al. .............. 345/1.3 |
| 6,292,157 B1 | * | 9/2001 | Greene et al. ................... 345/1.3 |
| 6,370,019 B1 | * | 4/2002 | Matthies et al. ............... 361/681 |
| 6,456,354 B2 | * | 9/2002 | Greene et al. .................. 349/153 |
| 6,476,783 B2 | * | 11/2002 | Matthies et al. ................ 345/82 |
| 6,498,592 B1 | * | 12/2002 | Matthies ......................... 345/1.1 |
| 6,554,671 B1 | * | 4/2003 | Hofmann et al. .............. 445/24 |
| 6,567,138 B1 | * | 5/2003 | Krusius et al. .................. 349/73 |

OTHER PUBLICATIONS

Joseph A. Castellano; *Handbook of Display Technology*; Academic Press, Inc. San Diego, CA 1992; Chapters 5–10, pp. 111–314.

* cited by examiner

*Primary Examiner*—Alexander Eisen
(74) *Attorney, Agent, or Firm*—Blakely, Sokoloff, Taylor & Zafman LLP

(57) ABSTRACT

According to one aspect of the present invention, an apparatus is provided in which a first display element and a second display element are arranged adjacent to each other forming a seam therebetween. Each display element includes a front panel that has a black matrix and a plurality of pixel elements disposed on a first surface thereof. The black matrix is patterned to cover at least a portion of the first surface along an edge of the first surface proximate the seam. The plurality of pixel elements are disposed in those regions of the first surface that are not covered by the black matrix. Each display element, in one embodiment, further includes a back panel attached to the first surface of a corresponding front panel. The first and second display elements are attached to a cover plate using an index-matching adhesive in which the corresponding adhesive is used to fill the seams between the first and second display elements to a predetermined thickness. In one embodiment, the back side of the seams between the back panels is filled with a black filler material that is designed to provide an optical match with the black matrix.

5 Claims, 9 Drawing Sheets

METHODS FOR TILING MULTIPLE DISPLAY ELEMENTS TO FORM A SINGLE DISPLAY

FIELD OF THE INVENTION

The present invention relates generally to the field of display technology. More specifically, the present invention relates to an apparatus, method, and system for tiling multiple display elements to form a single display.

BACKGROUND OF THE INVENTION

In the past several years, various types of display technologies have continued to advance rapidly. These various types of display technologies include liquid crystal display (LCD), plasma display panel (PDP), organic electroluminescent or organic light emitting diode (OLED), electroluminescent display (EL), vacuum fluorescent display (VFD), field emission display (FED), etc. In particular, significant development efforts and dramatic improvements have been made in the area of flat panel display (FPD) technology. FPDs are thin, flat electronic display used for displaying various kinds of information and data including text, graphics, video, etc. While LCD is still considered one of the most mature and common flat panel display technologies, other types of flat panel display technologies including OLED have generated a great deal of interest and attracted a lot of attention in research, development, and application in recent years.

One of the methods for forming larger flat panel display from smaller display units is referred to as tiling. Individual display tiles or units are usually arranged in an array or a matrix format and attached to each other along the edges of the display tiles to form a single tiled flat panel display of larger size. One of the major problems encountered in forming larger FPDs by tiling is to hide or conceal the seams (gap) between the adjacent display tiles so that the final assembled FPD can be viewed as a seamless single display unit. One approach to solve this problem is to put a black matrix (also called black grid or opaque mask herein) on a cover plate (also referred to as the optical integration plate (OIP) herein) that aligns with the individual pixels on the display tiles. In addition, the black matrix can also be used to improve the display contrast and/or to prevent light leakage from adjacent display pixels. FIG. 1 illustrates a tiled flat panel display configuration/structure in which a plurality of display tiles 100A–D are arranged in a matrix format and attached to a common cover plate 110. As shown in FIG. 1, the cover plate 110 with a black grid or black matrix 115 is placed on top of the display tiles 100A–D. The black matrix 115 is aligned with the individual pixels disposed in the display tiles 100A–D. In this configuration, the black matrix is used to improve the contrast of the display and also to hide the seams 120 between the display tiles 100A–D. The display tiles 100A–D in FIG. 1 also may include a plurality of back panels 130A–D that are attached to the bottom surfaces of the display tiles 100A–D. FIG. 2 shows a cross-sectional view of the tiled display structure illustrated in FIG. 1.

One of the problems with the approach of hiding the seams as described above is that the black matrix or black grid 115 is separated from the pixels by the glass thickness of the display tiles 100A–D. The separation of the black matrix from the pixels by the glass thickness causes some adverse consequences. First, the black matrix acts as an aperture with a size proportional to the ratio of the glass thickness and the pixel pitch. Second, the ability of the black matrix to hide the seams is inversely proportional to the glass thickness. Moreover, the pixel structure leads to a color shift, as the aperture effect selectively impacts the outer read and blue pixels, and is dependent on the viewing angle. These issues associated with the separation of the black matrix from the pixels by the glass thickness can be alleviated by reducing the glass thickness of the display tiles. For example, a 0.2 mm thick front panel can be used for display tiles having 1.75 mm pixel pitch. Glass thickness up to 0.6 mm can give acceptable performance with respect to aperturing, but does not completely obscure the seams. Furthermore, a reduction in pixel pitch will require a proportionate reduction in glass thickness requirements. For instance, a 1.0 mm pixel pitch would require a 0.11 mm thick front panel to meet rigorous display performance requirements or a 0.34 mm thickness to meet more relaxed requirements. In any event, the glass thickness required to ensure good display performance raises substantial issues with respect to manufacturing feasibility, availability, and costs.

BRIEF DESCRIPTION OF THE DRAWINGS

The present invention will be more fully understood by reference to the accompanying drawings, in which.

DETAILED DESCRIPTION

Figure 1:
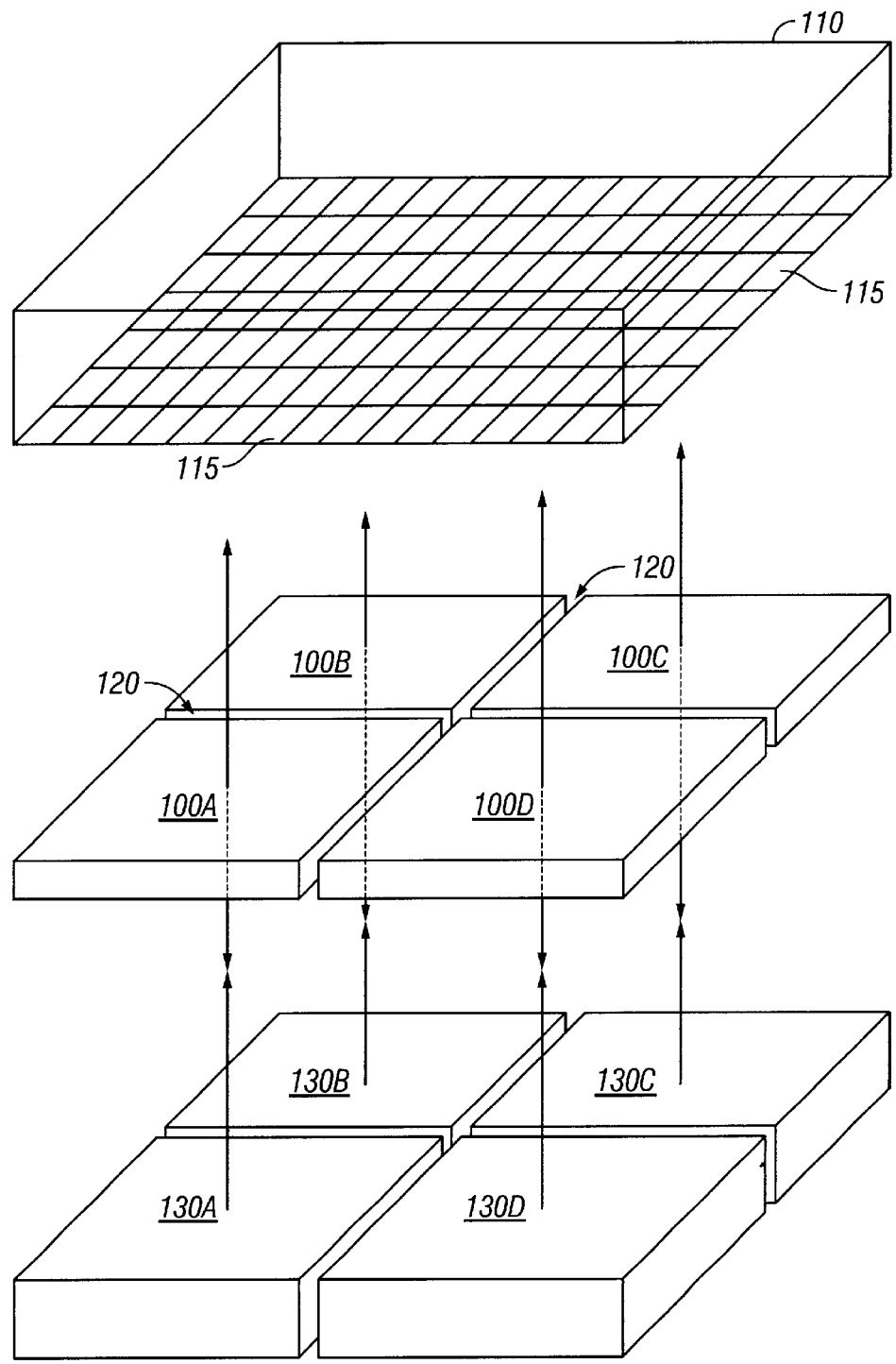
FIG. 1 is a structure of a prior art tiled flat panel display using a black matrix on a cover plate to hide the seams between display tiles.
Figure 2:
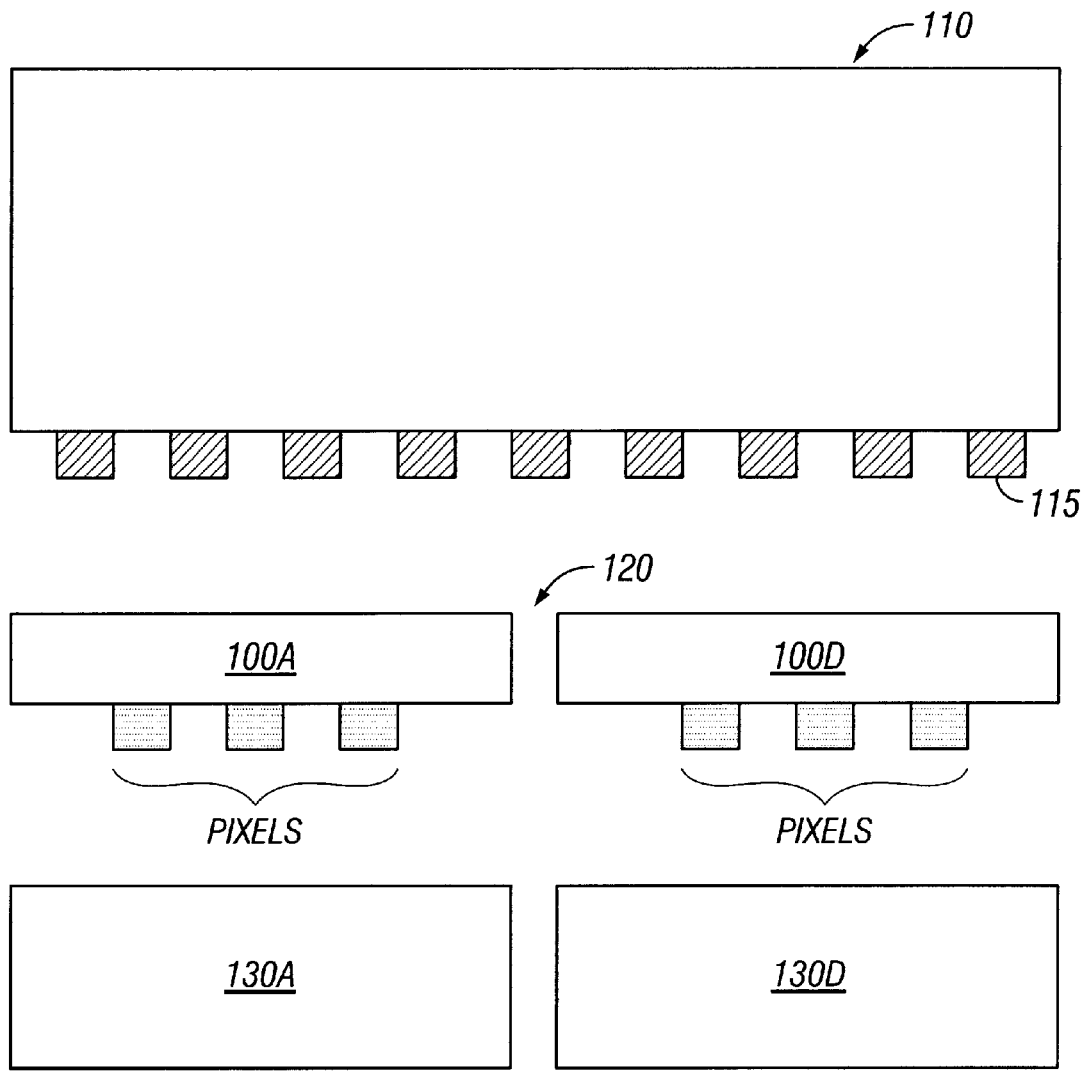
FIG. 2 shows a cross-sectional view of the display structure illustrated in FIG. 1.

In the following detailed description numerous specific details are set forth in order to provide a thorough understanding of the present invention. However, it will be appreciated by one skilled in the art that the present invention may be understood and practiced without these specific details.

In the discussion below, the teachings of the present invention are utilized to implement a method, apparatus, and a system for tiling multiple display elements to form a single display. For illustration and explanation purposes, the discussion below is focused the process and structure of tiling OLED individual display elements to form a single OLED flat panel display. However, it should be appreciated and understood by one skilled in the art the teachings of the present invention are also applicable to other types of display technologies including LCD, plasma panel display, field emission display, etc. In one embodiment, a plurality of individual display tiles are arranged adjacent to one another in a matrix format to form a single display. Each individual display tile comprises a plurality of display pixels (or subpixels) and a black matrix formed on a first surface of each display tile. In one embodiment, the black matrix deposited on each display tile covers at least a portion of the first surface of the respective display tile along the edges proximate the seams between the adjacent display tiles. In one embodiment, each display tile comprises a glass panel of a predetermined thickness, for example 0.6 mm. The glass panel is also called the front panel glass herein. In one embodiment, the front panel glass is manufactured with a black matrix or black grid using an appropriate material such as black chrome. In one embodiment, black chrome may be deposited, patterned and chemically treated to convert it into a black oxide. The material chosen for the black matrix should have high resistance to avoid shunting neighboring pixels or subpixels. The front panel glass is then coated with a layer of appropriate electrode material that is electrically conductive and optically transparent such as indium tin oxide (ITO). This layer is also called the anode layer herein. Alternatively, the coating and definition of the ITO layer can be done prior to the forming of the black matrix. In this case, the black matrix is applied to the front panel glass following ITO coat and definition. The pre-fabricated front panels are then run through OLED processes that are known in the art for constructing individual OLED display tiles. In one embodiment, after the construction of the individual display tiles have been completed, an index-matching adhesive is used to bond the completed tiles to a cover plate (e.g., the OIP). The adhesive is allowed to flow into the seams between the display tiles and fill the seams to a predetermined thickness. In one embodiment, the back side of the seams can be filled with a black material that is designed to provide an optical match with the black matrix. By integrating the black matrix with the pixel structure according to the teachings of the present invention, the problems associated with the separation of the black matrix from the pixels by the glass thickness are resolved. The teachings of the present invention are applicable to any scheme, method and system for tiling OLED display tiles to form a single tiled flat panel display. However, the teachings of the present invention are not limited to OLED technology and can also be applied to any other processes, schemes, methods, and systems for tiling flat panel displays with respect to other display technologies such as LCD, plasma, EL, FED, etc.

Figure 3:
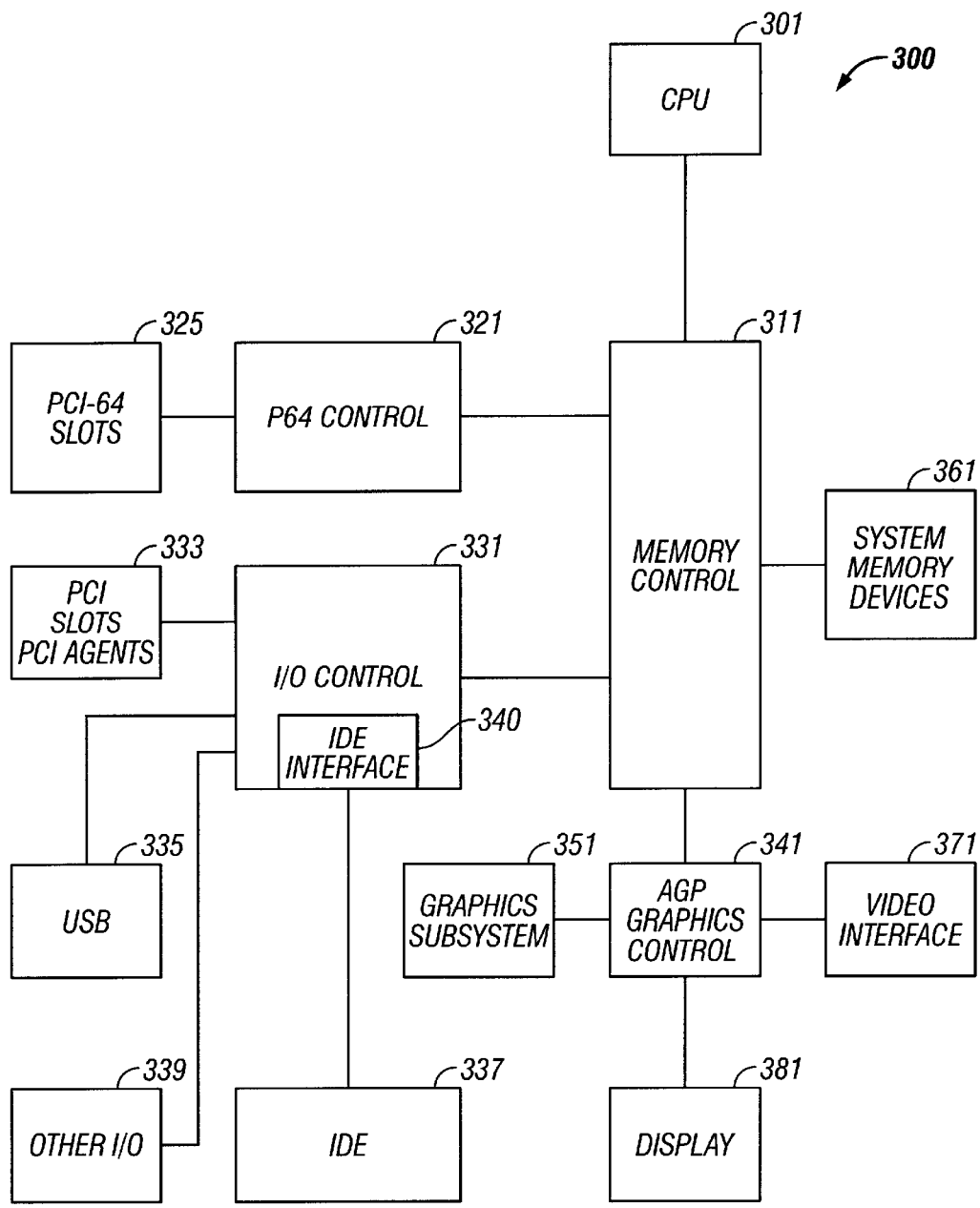
FIG. 3 shows a block diagram of one embodiment of a system in which the teachings of the present invention are implemented.

FIG. 3 shows a block diagram of one embodiment of a system configuration in which the teachings of the present invention are implemented. The system configuration 300 includes one or more central processing unit (CPU) 301, a memory control hub (also referred to as memory control unit or memory controller) 311, a P64 control unit 321, an Input/Output (IO) control unit 331, a graphics controller 341 coupled to a graphics subsystem 351 and a video interface unit 371, and a plurality of system memory devices 361. For the purposes of the present specification, the term "processor" or "CPU" refers to any machine that is capable of executing a sequence of instructions and shall be taken to include, but not be limited to, general purpose microprocessors, special purpose microprocessors, multimedia controllers and microcontrollers, etc. In one embodiment, the CPU 301 is a general-purpose microprocessor that is capable of executing an Intel Architecture instruction set. The CPU 301, the P64 control unit 321, the IO control unit 331, and the AGP graphics control unit 341 access the system memory devices 361 via the memory control unit 311. The memory control unit 311, in one embodiment, is responsible for servicing all memory transactions that target the system memory devices 361. The memory control unit 311 can be a stand-alone unit, an integrated part of a chipset, or a part of some larger unit that control the interfaces between various system components and the system memory devices 361. The P64 control unit 321 provides the interface control between a plurality of PCI-64 slots 325 and the memory control unit 311. The IO control unit 331 provides the interface control between the memory control unit 311 and various IO devices and ports including the PCI slots and PCI agents 333, a plurality of USB ports 335, a plurality of IDE devices 337, and other IO devices 339. The IO control unit 331, in one embodiment, contains an IDE host interface unit 340 that controls the interface between the IDE devices 337 and the memory control unit 311. The AGP graphics control unit 341 provides the interface control between the graphics subsystem 351 and the memory control unit 311. In one embodiment, the video interface unit includes a video capture unit (not shown) and a video decoder unit (not shown) that are configured to capture and decode video data from various sources such as VCRs, DVDs, etc. for input into the graphics controller 341. The graphics controller 341 is coupled to a display unit 381 that is used to display information to the end users. The display unit 381, in one embodiment, includes a tiled flat panel display constructed from tiling individual display tiles according to the teachings of the present invention. The process for constructing the tiled flat panel display and the structure thereof are described in more details below. While the discussion herein is focused on OLED technology for explanation and illustration purposes, it should be understood and appreciated by one skilled in the art that the teachings of the present invention are applicable to other types of display technologies including LCD, EL, FED, plasma panel display, etc.

Figure 4:
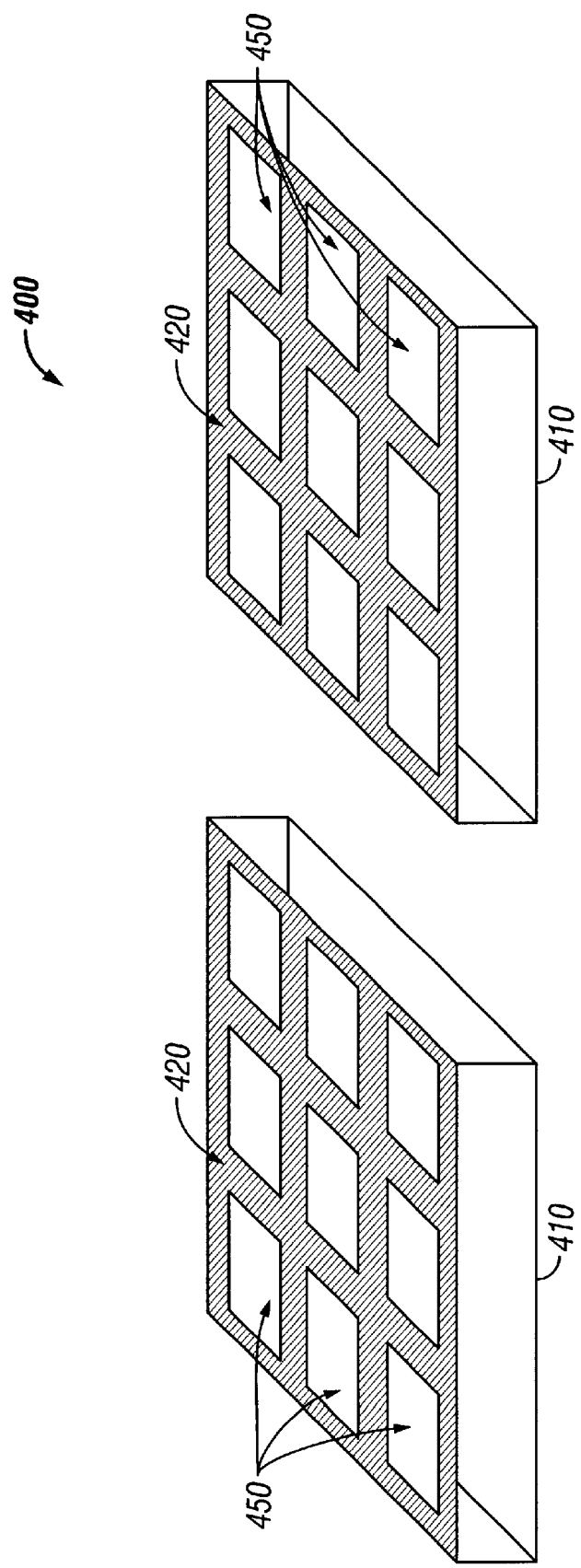
FIG. 4 shows a block diagram of one embodiment of a flat panel display structure according to the teachings of the present invention.

FIG. 4 shows a block diagram of one embodiment of a tiled display structure 400 according to the teachings of the present invention in which a black matrix is integrated with the pixel structure of the pixels. As shown in FIG. 4, the tiled display structure 400 comprises a plurality of display tiles 410 each of which comprises a black matrix 420 integrated with the pixel structure of the pixels 450 disposed therein. The black matrix 420 disposed in each individual display tile 410 can be used to improve the contrast of the display, block light leakage from adjacent pixels or subpixels as well as to give the tiled flat panel display an appearance of a "seamless" single unit. In other words, the optical matching of the seams between the display tiles and the black matrix disposed therein will make the seams much less visible if not invisible to the viewers. The integration of the black matrix with the pixel structure solves the aperture issues and problems described above because the black matrix is no longer separated from the pixels by the glass thickness.

In one embodiment, each individual display tile 410 (also called front panel glass herein) is manufactured with a black grid or black matrix using a suitable material such as black chrome, etc. In one embodiment, black chrome will be deposited, patterned, and chemically treated by techniques known in the art to convert it into black oxide. This black matrix or black film should be black on the glass interface side, not on the surface side. The material chosen should also have a high resistance to avoid shunting neighboring pixels or subpixels. In one embodiment, the front panel glass is coated with a layer of a first electrode material to form the anodes and address lines for the individual pixels or subpixels. This layer of the first electrode material is electrically conductive and optically transparent. Various materials can be used for the first electrode layer including indium tin oxide (ITO), zinc oxide, zinc tin oxide, etc. In one embodiment, ITO is used for the first electrode layer. This layer can be fabricated (e.g., deposited and patterned) before the formation of the black matrix or subsequent to the formation of the black matrix, depending upon the specific implementations and applications of the present invention. For example, certain manufacturing processes may be designed and set up such that the ITO coating will be carried out before the formation of the black matrix 420.

Continuing with the present discussion, the pre-fabricated front panel glass having the black matrix and the ITO coating layer formed thereon can then be run through any known OLED process or method to construct OLED display device (e.g., to construct individual display pixels or subpixels). A typical OLED process to construct OLED display device is described in more detail below. One of the steps in the OLED process is the deposition and patterning of wells that are used to define the pixels or subpixels. In one embodiment, a layer of a suitable material such as polyimide or photosensitive polyimide is deposited and patterned on top of the ITO layer and the black matrix to define wells for the pixels or subpixels. Alternatively, the black matrix itself can also be used to define the pixel or sub-pixel wells. The formation of the wells using either polyimide material or black matrix is described in more detail below.

In one embodiment, after the individual display tiles have been completed, an index-matching adhesive can be used to bond the completed tiles to a cover plate (e.g., the OIP). The thickness of the adhesive applied to the OIP, prior to bonding, is carefully controlled. The bond line thickness is also controlled through the use of certain raised features, either on the OIP or the tile surface. Alternatively, glass beads can also be used to control the bond line thickness. In any case, the features used to control the bond line thickness needs to be optically matched. In one embodiment, the viscosity of the adhesive also needs to be controlled carefully to provide for a controlled flow of the adhesive material. Through these various controls, the adhesive is allowed to flow into the seams between the tiles and fill them to a predetermined level or predetermined thickness. Preferably, this predetermined thickness should be the same as the glass thickness. In one embodiment, the back side of the seams can then be filled with a suitable black material that is designed to provide an optical match with the black matrix to make the seams much less visible or invisible to the viewers. The adhesive material and the black material used to fill the seams also serve to provide additional environmental protection for the display tiles by inhibiting moisture and oxygen ingression at the tile edges. Such protection provided by these two materials may not be needed if an effective passivation over the OLED device is used. It can be appreciated and understood by one skilled in the art that the integration of the black matrix with the pixel structure according to the teachings of the present invention solves the problems and issues that exist in prior art tiling techniques because the black matrix is no longer separated from the pixels or subpixels by the glass thickness. Furthermore, the use of a black material designed to provide an optical match with the black matrix to fill the back side of the seams effectively makes the completed flat panel display appear seamless to the viewers.

Figure 5:
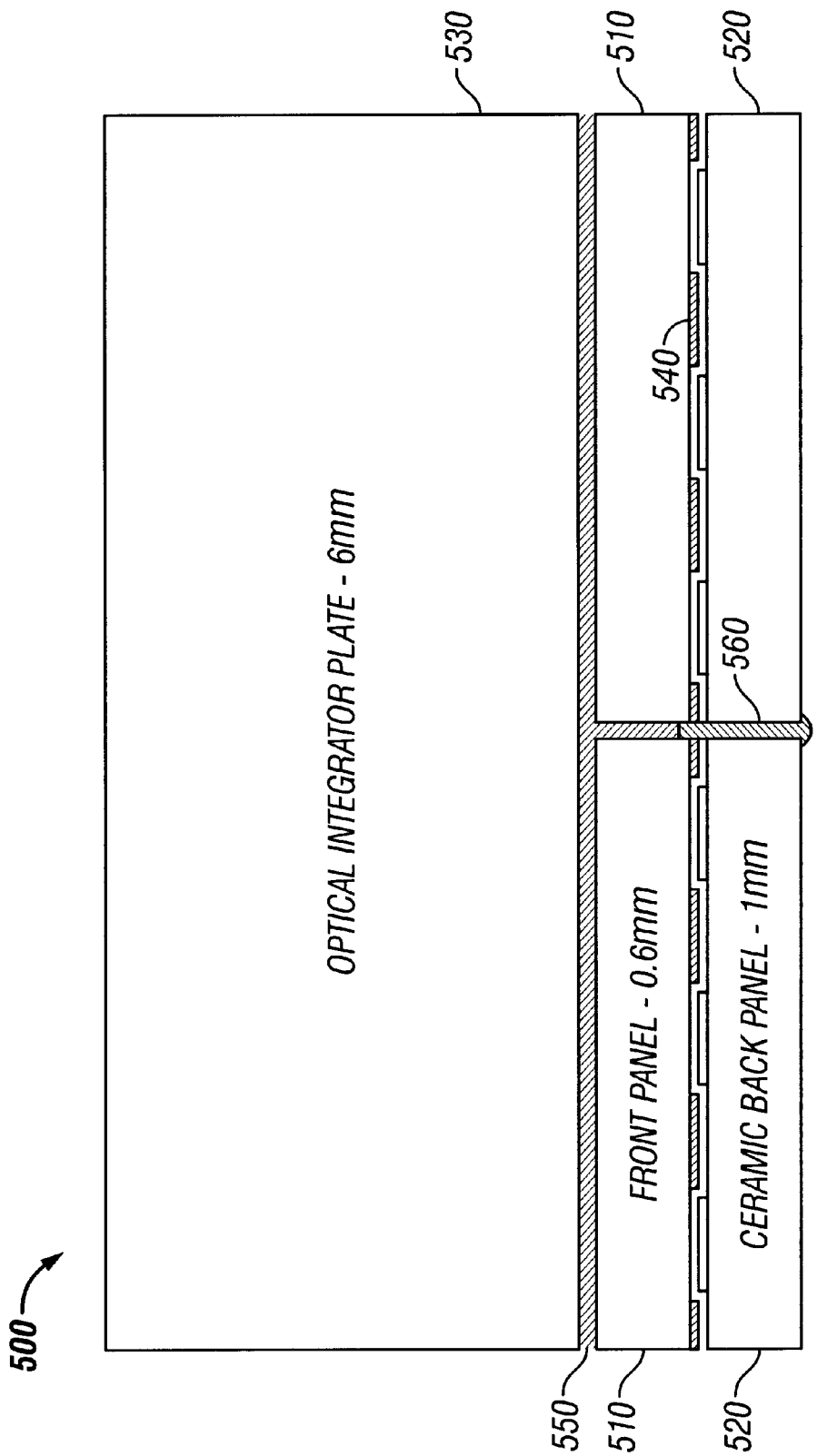
FIG. 5 shows a cross section view of one embodiment of a flat panel display structure in accordance with the teachings of the present invention.

FIG. 5 shows a cross section view of a tiled flat panel display structure 500 according to the teachings of the present invention. In one embodiment, as shown in FIG. 5, the display matching adhesive (i.e., integrator plate (IP) adhesive) 550. In one embodiment, the index-matching adhesive 550 is coated uniformly on one surface of the OIP to a controlled thickness. As described above, the bond line thickness can be controlled via raised features either on the OIP or the tile surface. Alternatively, glass beads can also be used to control the bond line thickness. The bonding process results in a controlled flow of the adhesive 550 into the seams between the display tiles to a predetermined depth or thickness.

Thereafter, a black filler 560 can be injected into the seams between the ceramic back panels 520 following the display array assembly. Filling the seams with a black material designed to provide an optical match with the black matrix reduces the contrast between the black matrix surface and the seam gap. Thus, the completed tiled display will have a seamless appearance.

Figure 6A:
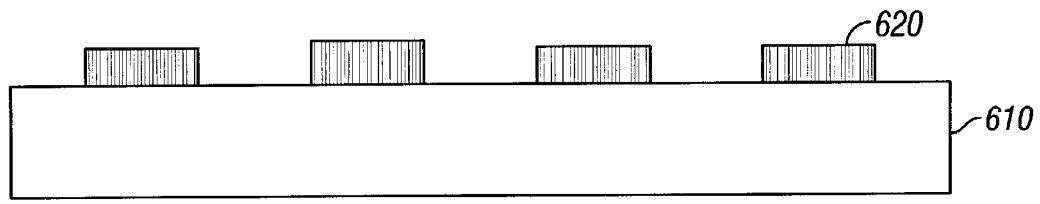
FIGS. 6A–6E show cross section views of various stages of a display structure according to the teachings of the present invention.
Figure 6B:
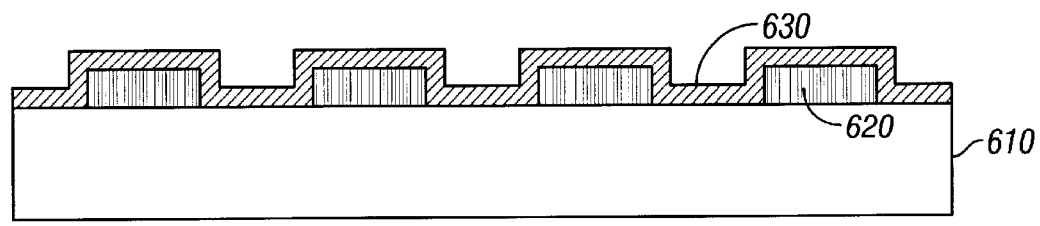

FIGS. 6A–6E illustrate one embodiment of a process for constructing OLED display devices. The process described herein combines an innovative method of incorporating a black matrix with subsequent process steps that are typical of an OLED process. The OLED devices are constructed on a substrate 610. In one embodiment, the substrate 610 is made of transparent glass of quality that is acceptable for flat panel display. As shown in FIG. 6A, a black matrix 620 is deposited and patterned on one surface of the substrate 610. As described above, in one embodiment, the black matrix 620 is constructed using a suitable material such as black chrome. Thereafter, as shown in FIG. 6B, a first electrode material 630 such as ITO is deposited and structure 500 comprises a plurality of individual display tiles (also called front panels) 510 attached to a plurality of corresponding back panels 520 and a cover plate (also called optical integration plate or OIP herein) 530. In one embodiment, the front panels and the optical integration plate are made of suitable transparent material such as glass. In one embodiment, the back panels may be made of ceramic material. In one embodiment, the thickness of the optical integration plate is approximately 6 mm, the thickness of the front panel glass is about 0.6 mm, and the thickness of the back panel is about 1 mm. It should be understood and appreciated by one skilled in the art that the various types of materials and dimensions shown in FIG. 5 and described herein are for illustration and explanation purposes and should not limit the scope of the present invention in anyway.

As shown in FIG. 5, in one embodiment, each front panel comprises a black matrix 540 integrated with the pixel structure of the pixels or subpixels disposed on one surface of the respective front panel. As such, the black matrix 540 is not separated from the pixels or subpixels by the glass thickness of the front panel. In one embodiment, the black matrix 540 is applied to the front panel following the ITO coat and definition. In one embodiment, the black matrix 540 can also be used to define the wells for the pixels or subpixels. In this case, the black matrix 540 will be defined photolithographically. In another embodiment, the black matrix 540 can be deposited and patterned first and then the ITO coating can be deposited and patterned over the black matrix 540.

Figure 6C:
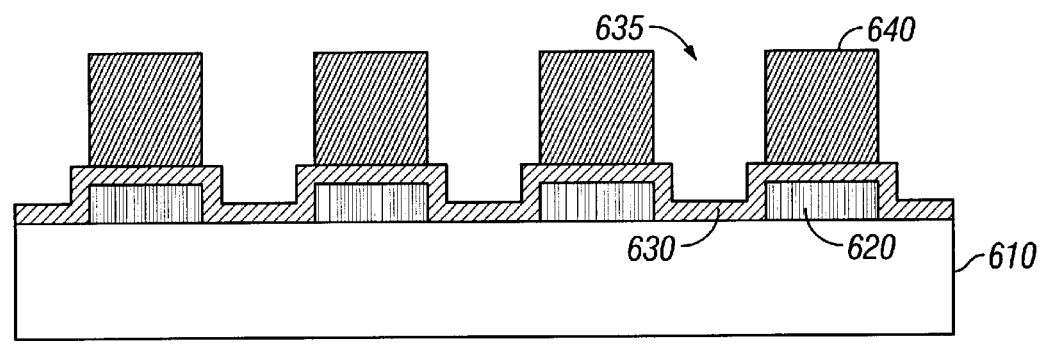

As described above, the pre-fabricated front panels are then run through an OLED construction process. The completed individual display tiles are bonded to the OIP using an index-patterned on the surface of the glass substrate 610 to form the anodes and address lines for the individual pixels or subpixels. Subsequently, as shown in FIG. 6C, a layer of suitable material such as polyimide is deposited and patterned on top of the ITO layer 630 and the black matrix layer 620 to form the wells 635 for the pixels or subpixels.

Figure 6D:
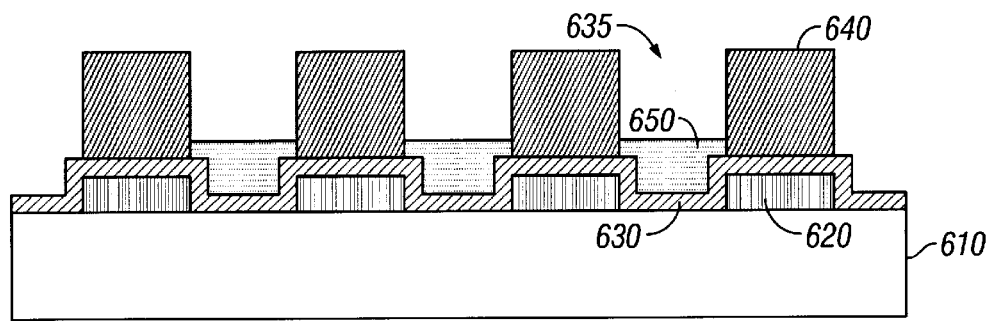
Figure 6E:
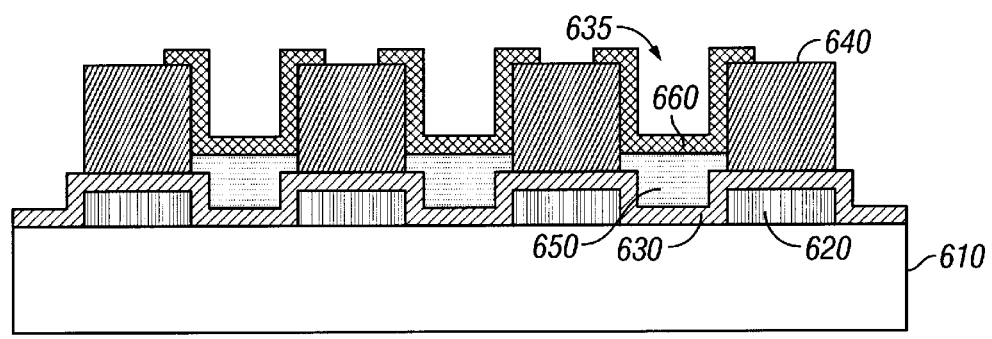

Alternatively, the black matrix 620 can also be used to define the wells for the pixels or subpixels. Referring now to FIG. 6D, layers of organic electroluminescent materials (collectively shown as one layer 650) are then deposited into the corresponding wells defined by the wall structures 640. It is well known in the art that layers 650 may include a hole injection layer, a hole transport layer, an emission layer, and an electron transport layer, etc. Thereafter, as shown in FIG. 6E, a layer of second electrode material is deposited and patterned on top of the other layers to form the anode layer 660. It should be understood by one skilled in the art that the teaching of the present invention described herein apply to other processes for fabricating OLED displays.

Figure 7:
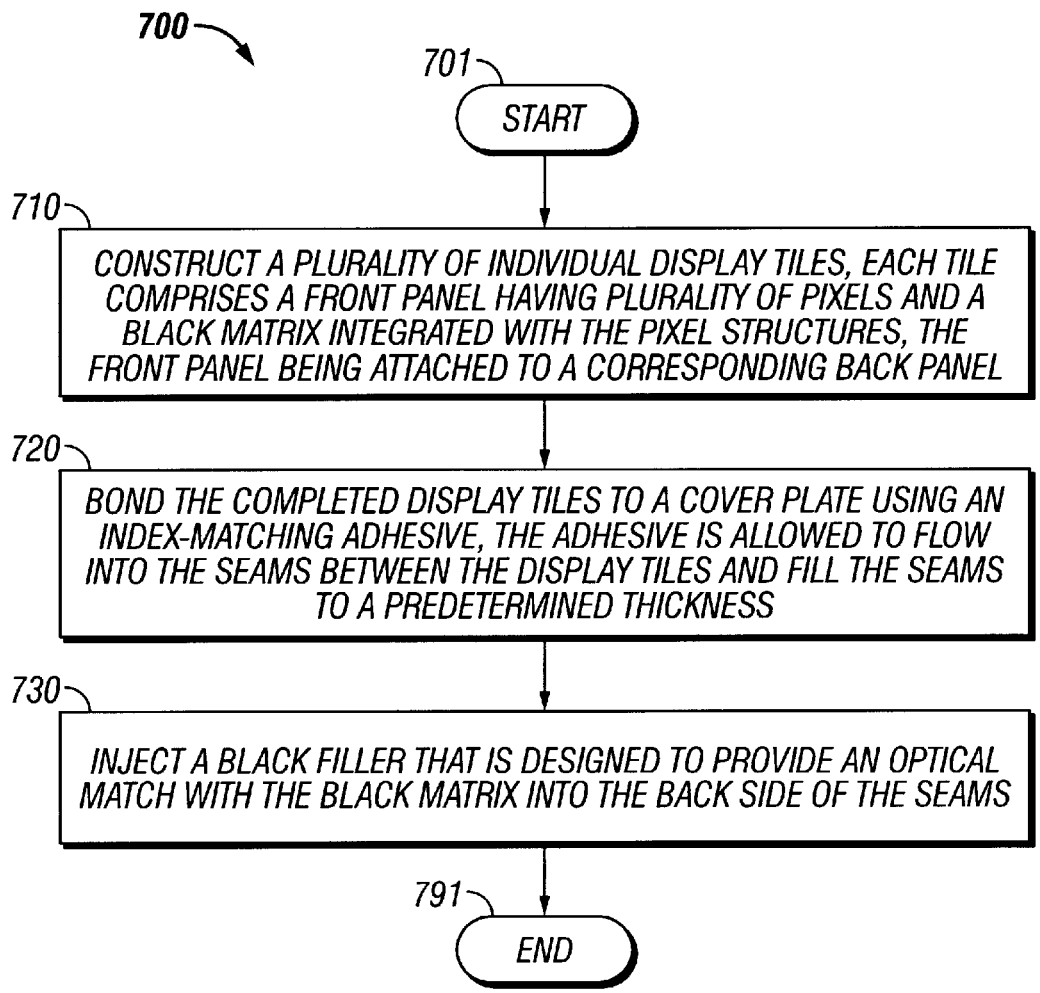
FIG. 7 shows a flow diagram of a method according to the teachings of the present invention.

FIG. 7 shows a flow diagram of one embodiment of a method 700 according to the teachings of the present invention. At block 710, a plurality of individual display tiles are constructed with each display tile comprising a front panel. Each front panel comprises a plurality of pixels and black matrix integrated with the pixel structures. In one embodiment, each front panel is attached to a corresponding back panel. A display tile having a front panel attached to a corresponding back panel is also referred to as a display module herein. At block 720, the completed display tiles are bonded to a cover plate using an index-matching adhesive that controllably allowed to flow into the seams between the display tiles and fill the seams to a predetermined thickness. At block 730, a black filler material designed to provide an optical match with the black matrix is injected into the back side of the seams. This is done to reduce the contrast between the black matrix surface and the seam gap so that the tiled display will have a seamless appearance.

Figure 8:
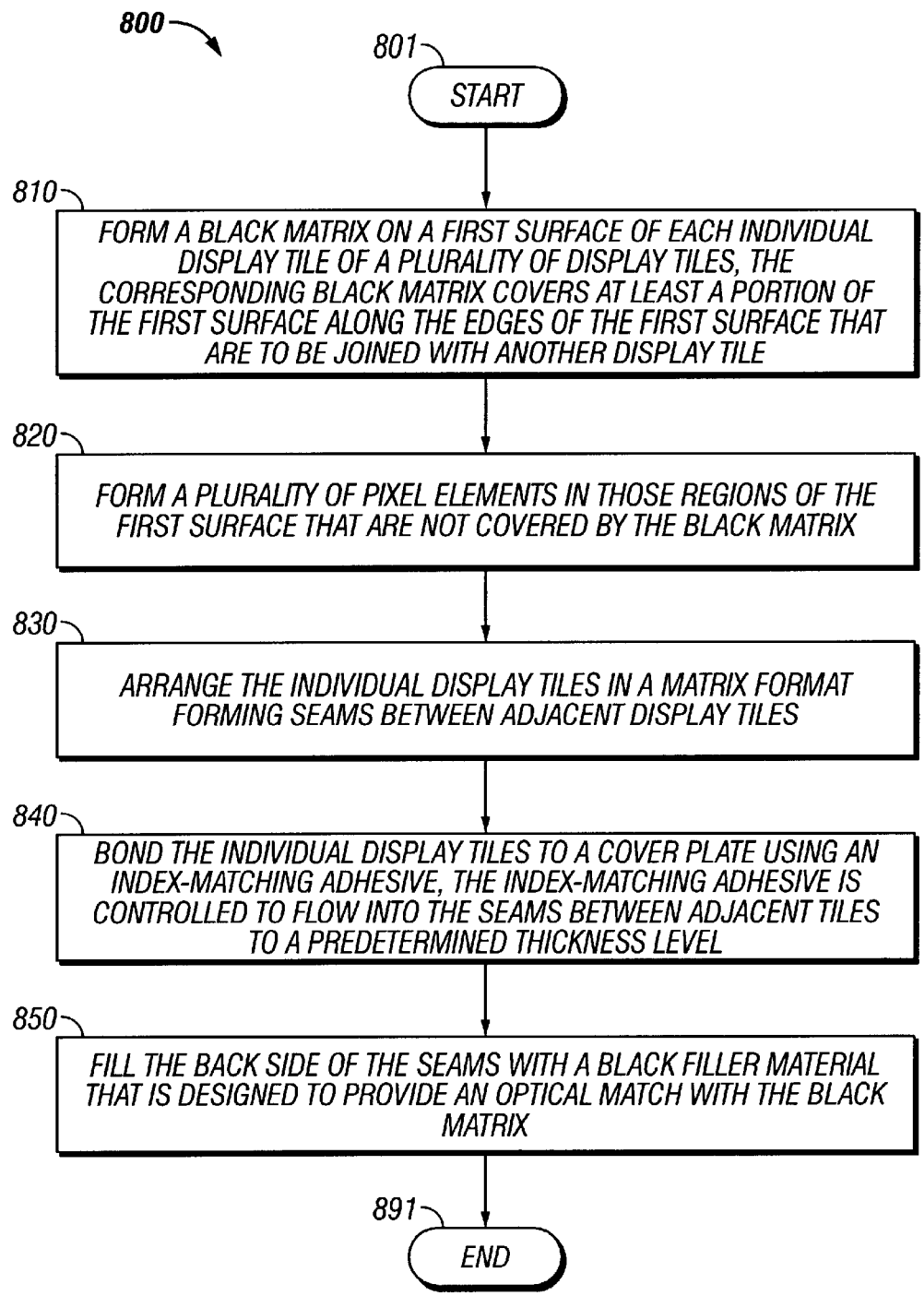
FIG. 8 shows a flow diagram of a method according to the teachings of the present invention.

FIG. 8 shows a more detailed flow diagram of the method 700 described above with respect to FIG. 7. At block 810, a plurality of individual display tiles (a display tile is also called a front panel herein) are constructed in which a corresponding black matrix is formed on a first surface of each individual display tile. The black matrix covers at least a portion of the first surface. An example of the black matrix formed on the surface of a display tile is shown in FIGS. 4 and 5. At block 820, a plurality of pixel elements is formed in those regions of the first surface that are not covered by the corresponding black matrix. An example of the positioning of the pixel elements are shown in FIGS. 4 and 5 described above. In one embodiment, each individual display tile (also called a front panel) is attached to a corresponding back panel. A display tile having a front panel attached to a corresponding back panel is also called a display module herein. At block 830, the completed individual display tiles are arranged in a matrix or array format forming the seams between adjacent display tiles. At block 840, the completed display tiles are bonded to a cover plate using an index-matching adhesive that controllably allowed to flow into the seams between the display tiles and fill the seams to a predetermined thickness. An example of the bonding process is shown in FIG. 5. At block 850, a black filler material designed to provide an optical match with the black matrix is used to fill the back side of the seams, as illustrated in FIG. 5. The black filler is used to make the seams between display tiles much less visible or invisible to the viewers so that the tiled flat panel display will have a seamless appearance.

The invention has been described in conjunction with the preferred embodiment. It is evident that numerous alternatives, modifications, variations and uses will be apparent to those skilled in the art in light of the foregoing description.

What is claimed is:

1. A method comprising:

forming a plurality of individual display tiles including
forming a black matrix on a first surface of each individual display tile by
depositing a layer of black matrix material on the first surface;
patterning the layer of black matrix material to form the corresponding black matrix, the black matrix covering at least a portion of the first surface along edges of each individual display tile that are to be joined with another display tile, each individual display tile having a plurality of pixel elements disposed in regions of the first surface that are not covered by the black matrix; and
chemically treating the patterned layer of black matrix material to convert the black matrix material into black oxide, joining the plurality of the individual display tiles along their respective edges forming a corresponding seam between two adjacent display tiles, and filling the corresponding seam between the two adjacent tiles with an index-matching adhesive material to a predetermined thickness level.

2. The method of claim 1 wherein black chrome is used as the black matrix material.

3. The method of claim 1 wherein the display tiles are bonded to a cover plate using the index matching adhesive material, the bonding of the display tiles to the cover plate is designed to allow the index-matching adhesive material to flow into the corresponding seam and fill the corresponding seam to the predetermined thickness level.

4. The method of claim 1 wherein the forming of the plurality of individual display tiles further includes
forming the plurality of pixel elements in the regions on the first surface that are not covered by the black matrix.

5. The method of claim 4 wherein each display tile is attached to a back plate and
a black filler material is used to fill a corresponding seam between two adjacent back plates to reduce contrast between the black matrix and the seam.

\* \* \* \* \*